(12) United States Patent
Li et al.

(10) Patent No.: US 9,722,050 B2
(45) Date of Patent: Aug. 1, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chih-Sheng Li, Hsinchu (TW); Hsin-Chieh Huang, Hsinchu (TW); Chi-Wen Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/967,176

(22) Filed: Dec. 11, 2015

(65) Prior Publication Data

US 2017/0069504 A1 Mar. 9, 2017

Related U.S. Application Data

(60) Provisional application No. 62/214,770, filed on Sep. 4, 2015.

(51) Int. Cl.
| | |
|---|---|
| *H01L 29/66* | (2006.01) |
| *H01L 21/308* | (2006.01) |
| *H01L 21/31* | (2006.01) |
| *H01L 29/06* | (2006.01) |
| *H01L 29/78* | (2006.01) |

(Continued)

(52) U.S. Cl.
CPC .... *H01L 29/66772* (2013.01); *H01L 21/3081* (2013.01); *H01L 21/31* (2013.01); *H01L 27/10879* (2013.01); *H01L 29/0649* (2013.01); *H01L 29/0657* (2013.01); *H01L 29/66545* (2013.01); *H01L 29/785* (2013.01); *H01L 29/786* (2013.01); *H01L 29/7831* (2013.01)

(58) Field of Classification Search
CPC ............. H01L 21/8232; H01L 21/8234; H01L 21/823412; H01L 21/823431; H01L 21/823821; H01L 21/845; H01L 27/0886; H01L 27/0924; H01L 27/10879; H01L 27/1211; H01L 29/41791; H01L 29/66772; H01L 29/66795; H01L 29/7831; H01L 29/785; H01L 29/786
See application file for complete search history.

(56) References Cited

U.S. PATENT DOCUMENTS

| | | |
|---|---|---|
| 9,515,184 B2 | 12/2016 | Chiang et al. |
| 2013/0237039 A1 | 9/2013 | Sleight et al. |

(Continued)

FOREIGN PATENT DOCUMENTS

| | | |
|---|---|---|
| KR | 20150030599 A | 3/2015 |
| TW | 201344915 A | 11/2013 |

*Primary Examiner* — Eduardo A Rodela
(74) *Attorney, Agent, or Firm* — Slater Matsil, LLP

(57) ABSTRACT

A semiconductor device includes a substrate, at least one active semiconductor fin, at least one first dummy semiconductor fin, and at least one second dummy semiconductor fin. The active semiconductor fin is disposed on the substrate. The first dummy semiconductor fin is disposed on the substrate. The second dummy semiconductor fin is disposed on the substrate and between the active semiconductor fin and the first dummy semiconductor fin. A top surface of the first dummy semiconductor fin and a top surface of the second dummy semiconductor fin are curved in different directions.

20 Claims, 9 Drawing Sheets

(51) Int. Cl.
*H01L 29/786* (2006.01)
*H01L 27/108* (2006.01)

(56) References Cited

U.S. PATENT DOCUMENTS

| | | |
|---|---|---|
| 2013/0277760 A1 | 10/2013 | Lu et al. |
| 2015/0069528 A1* | 3/2015 | Chiang ................ H01L 29/785 257/401 |
| 2015/0206954 A1 | 7/2015 | Lin |
| 2016/0260636 A1* | 9/2016 | Lin ................ H01L 21/823412 |

* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 62/214,770, filed Sep. 4, 2015, which is herein incorporated by reference.

BACKGROUND

Semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalls.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
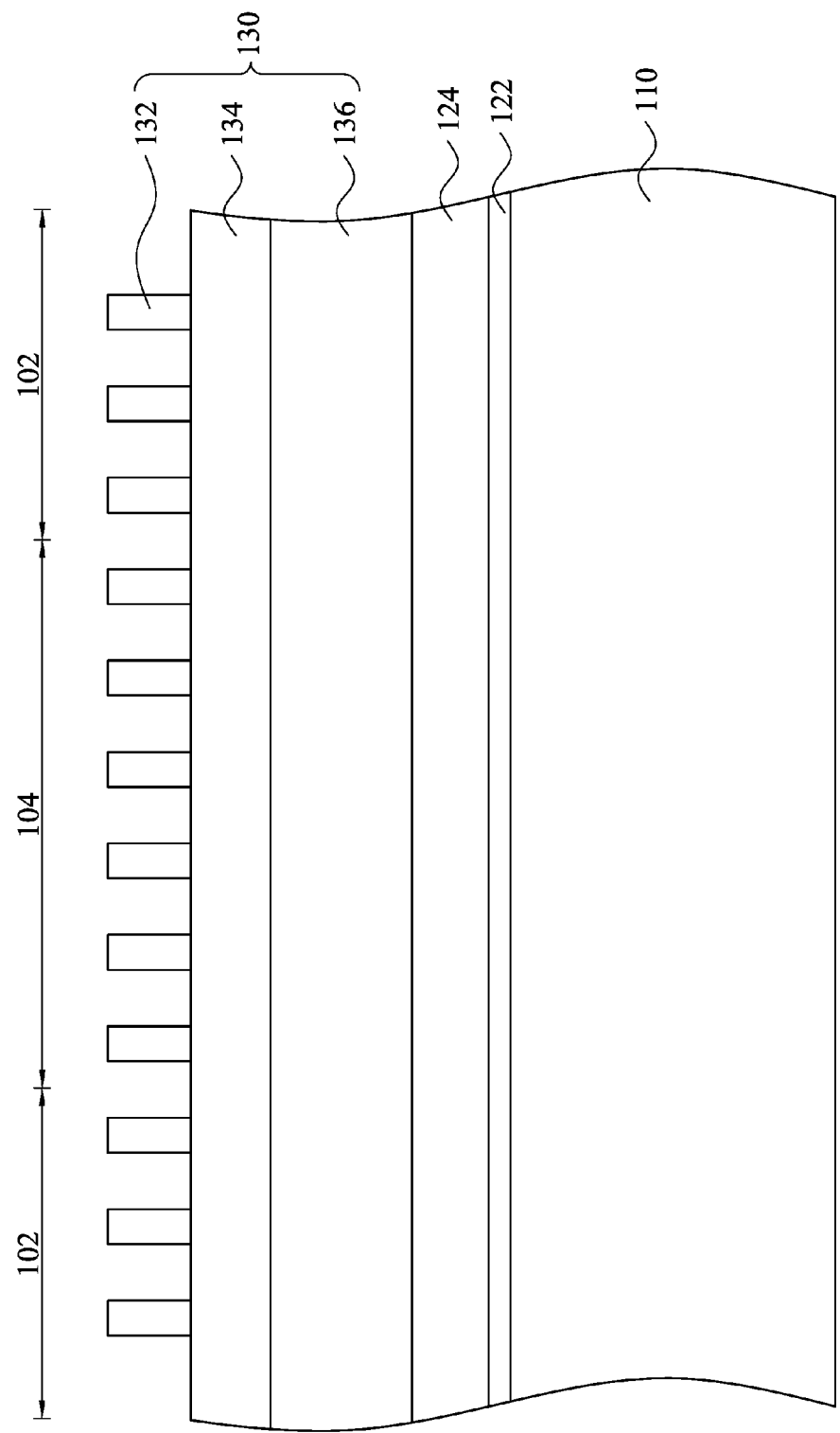
FIGS. 1A to 1H are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a FinFET device. The FinFET device, for example, may be a complementary metal-oxide-semiconductor (CMOS) device including at least one P-type metal-oxide-semiconductor (PMOS) FinFET device and at least one N-type metal-oxide-semiconductor (NMOS) FinFET device. The following disclosure will continue with a FinFET example to illustrate various embodiments of the present application. It is understood, however, that the application should not be limited to a particular type of device.

FIGS. 1A to 1H are cross-sectional views of a method for manufacturing a semiconductor device at various stages in accordance with some embodiments of the present disclosure. Reference is made to FIG. 1A. A substrate 110 is provided. The substrate 110 has at least one active region 102 and at least one dummy region 104. For example, in FIG. 1A, the substrate 110 has two active regions 102 and one dummy region 104, and the dummy region 104 is present between the two active regions 102. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

A pad layer 122 and a mask layer 124 are formed on the substrate 110. The pad layer 122 includes a dielectric material, such as silicon oxide, silicon nitride, silicon oxynitride, or any other suitable dielectric material. The mask layer 124 includes a dielectric material, such as silicon oxide, silicon nitride, silicon oxynitride, or any other suitable dielectric material. In some embodiments, the mask layer 124 is a hard mask layer. In some embodiments, the pad layer 122 is a silicon oxide layer deposited on the substrate 110, and the mask layer 124 is a silicon nitride layer deposited on the pad layer 122. The pad layer 122 and the mask layer 124 can be formed by thermal oxidation, chemical oxidation, atomic layer deposition (ALD), or any other appropriate method. In some embodiments, the thickness of the pad layer 122 may be between about 100-800 Angstroms, and the thickness of the mask layer 124 may be between about 200-2000 Angstroms.

A lithography process defining semiconductor fins on the semiconductor substrate 110 is performed. In some embodiments, a tri-layer photoresist 130 may be used, including a photoresist (PR) layer 132 as the top or uppermost portion, a middle layer 134, and a bottom layer 136. The tri-layer photoresist 130 is disposed on the mask layer 124. The tri-layer photoresist 130 provides the PR layer 132, the middle layer 134 which may include anti-reflective layers or backside anti-reflective layers to aid in the exposure and focus of the PR processing, and the bottom layer 136 which may be a hard mask material; for example, a nitride. To pattern the tri-layer photoresist 130, the PR layer 132 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 132. This patterned PR layer 132 is then used to etch the underlying middle layer 134 and bottom layer 136 to form an etch mask for the target layer; here, the mask layer 124.

Figure 1B:
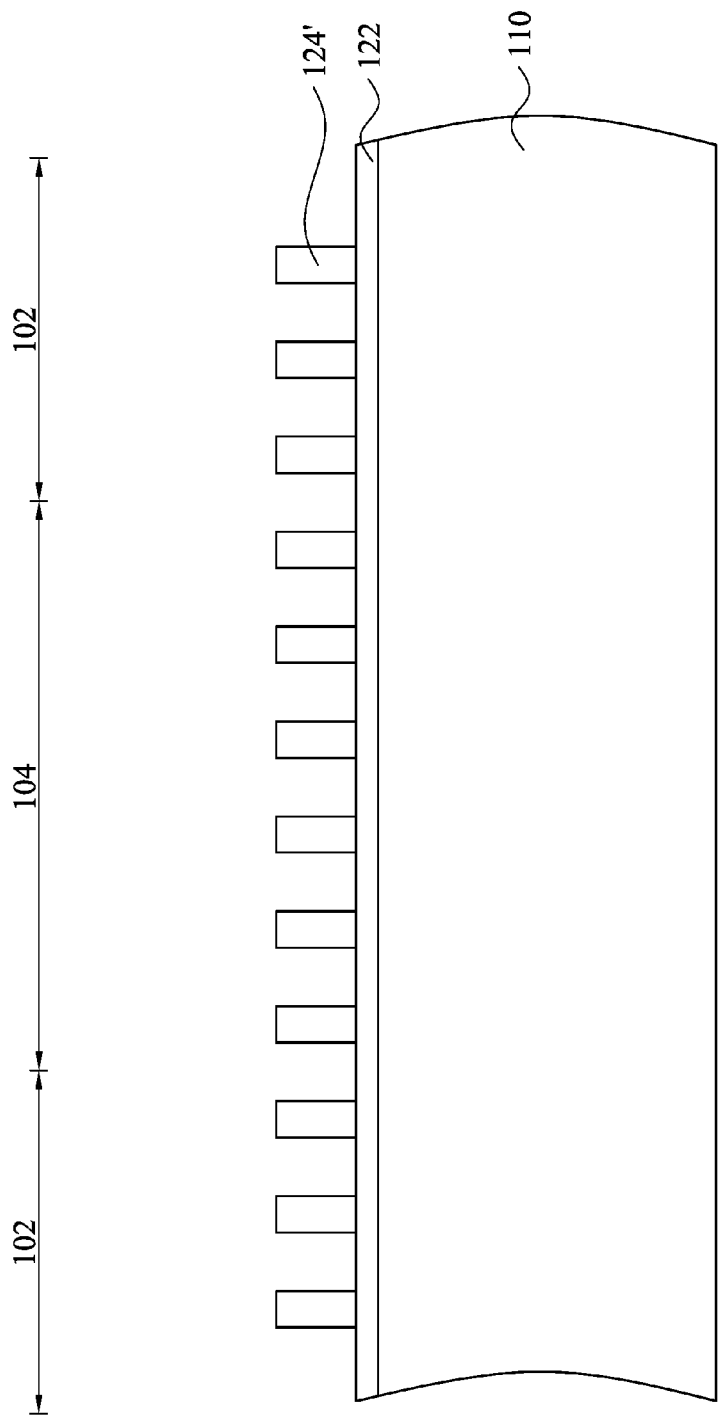

Reference is made to FIG. 1B. A trench etching is performed to form patterned mask layer 124'. The patterned PR layer 132 (see FIG. 1A) is used as a mask during the trench etching. In the trench etching, the middle layer 134, the bottom layer 136, and the mask layer 124 (see FIG. 1A) may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $C_{12}$, $CHC_{13}$, $CC_{14}$, and/or $BC_{13}$), bromine-containing gas (e.g., HBr and/or $CHBR_3$), oxygen-containing gas, iodine-containing gas, other suitable gases and/or plasmas, or combinations thereof. The etching process may include a multiple-step etching to gain etch selectivity, flexibility and desired etch profile. After the mask layer 124 is patterned, the PR layer 132, the middle layer 134, and the bottom layer 136 are removed.

Figure 1C:
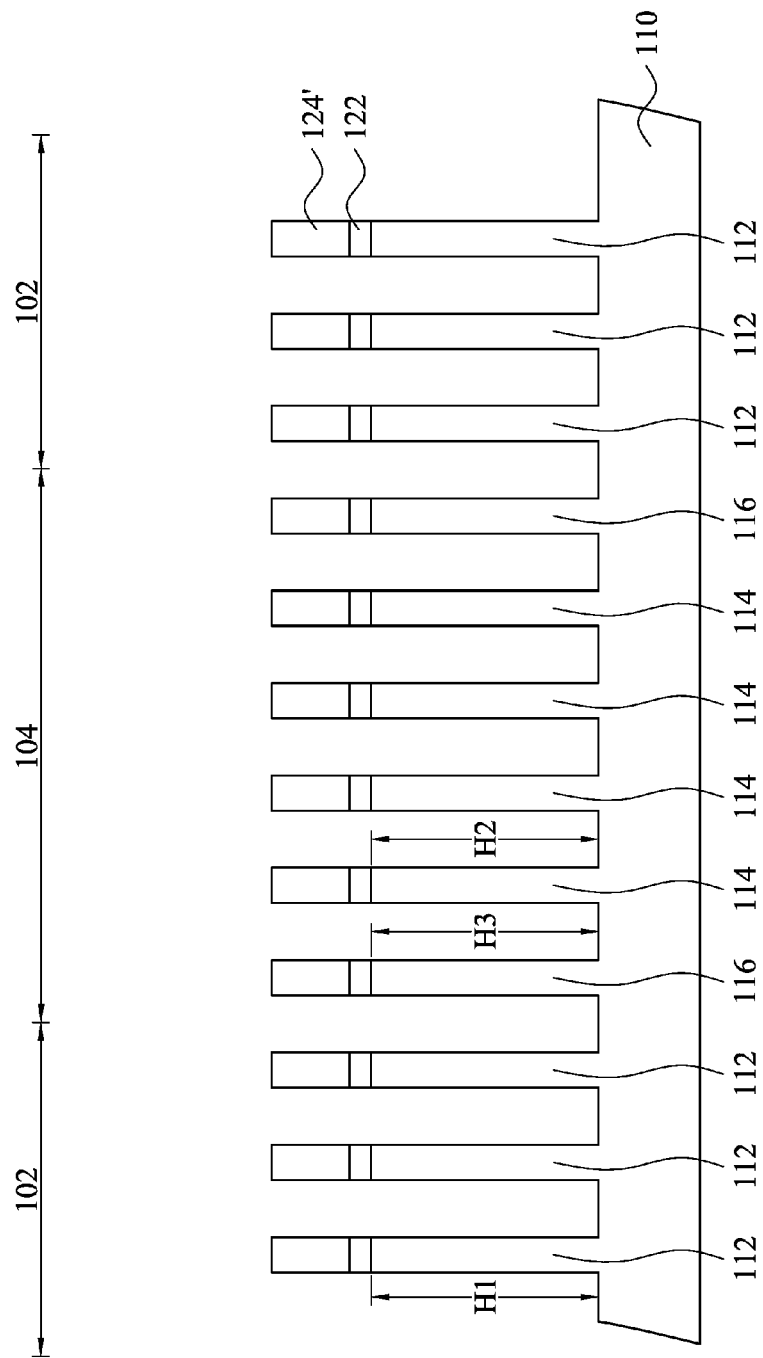

Reference is made to FIG. 1C. Using the patterned mask layer 124' as a mask, the pad layer 120 and the substrate 110 are etched to form a plurality of semiconductor fins by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $C_{12}$, $CHC_{13}$, $CC_{14}$, and/or $BC_{13}$), bromine-containing gas (e.g., HBr and/or $CHBR_3$), oxygen-containing gas, iodine-containing gas, other suitable gases and/or plasmas, or combinations thereof. The etching process may include a multiple-step etching to gain etch selectivity, flexibility and desired etch profile.

In FIG. 1C, the semiconductor fins includes at least one active semiconductor fin 112, at least one first dummy semiconductor fin 114, and at least one second dummy semiconductor fin 116. For example, in FIG. 1C, there are six of the active semiconductor fins 112, four of the first dummy semiconductor fin 114, and two of the second dummy semiconductor fins 116, and the claimed scope is not limited in this respect. The six active semiconductor fins 112 are divided into two groups and respectively disposed in the two active regions 102. In FIG. 1C, there are three of the active semiconductor fins 112 in one of the active regions 102. The first dummy semiconductor fins 114 and the second dummy semiconductor fins 116 are disposed in the dummy region 104. That is, the first dummy semiconductor fins 114 and the second dummy semiconductor fins 116 are disposed between the two groups of the active semiconductor fins 112. The first dummy semiconductor fins 114 are disposed adjacent to each other to form a group, and one of the second dummy semiconductor fins 116 is disposed between the group of the first dummy semiconductor fins 114 and one group of the active semiconductor fins 112. Therefore, the first dummy semiconductor fins 114 can be referred to be inner dummy semiconductor fins, and the second dummy semiconductor fins 116 can be referred to be outer dummy semiconductor fins.

The first and second dummy semiconductor fins 114 and 116 have no functionality in the semiconductor device but make the device processes more uniform, more reproducible, and more manufacturable. The active semiconductor fins 112 have functionality in the semiconductor device. Having the first and second dummy semiconductor fins 114 and 116 located next to the active semiconductor fins 112, the active semiconductor fins 112 may be formed under a fairly similar formation surrounding in all associated locations. A consistent formation surrounding enhances uniform active semiconductor fins 112 in all associated locations, in term of fin's critical dimension (CD), profile and height.

In some embodiments, the height H1 of the active semiconductor fins 112, the height H2 of the first dummy semiconductor fins 114, and the height H3 of the second dummy semiconductor fins 116 can be about 100 nm to about 150 nm, and the claimed scope is not limited in this respect.

Figure 1D:
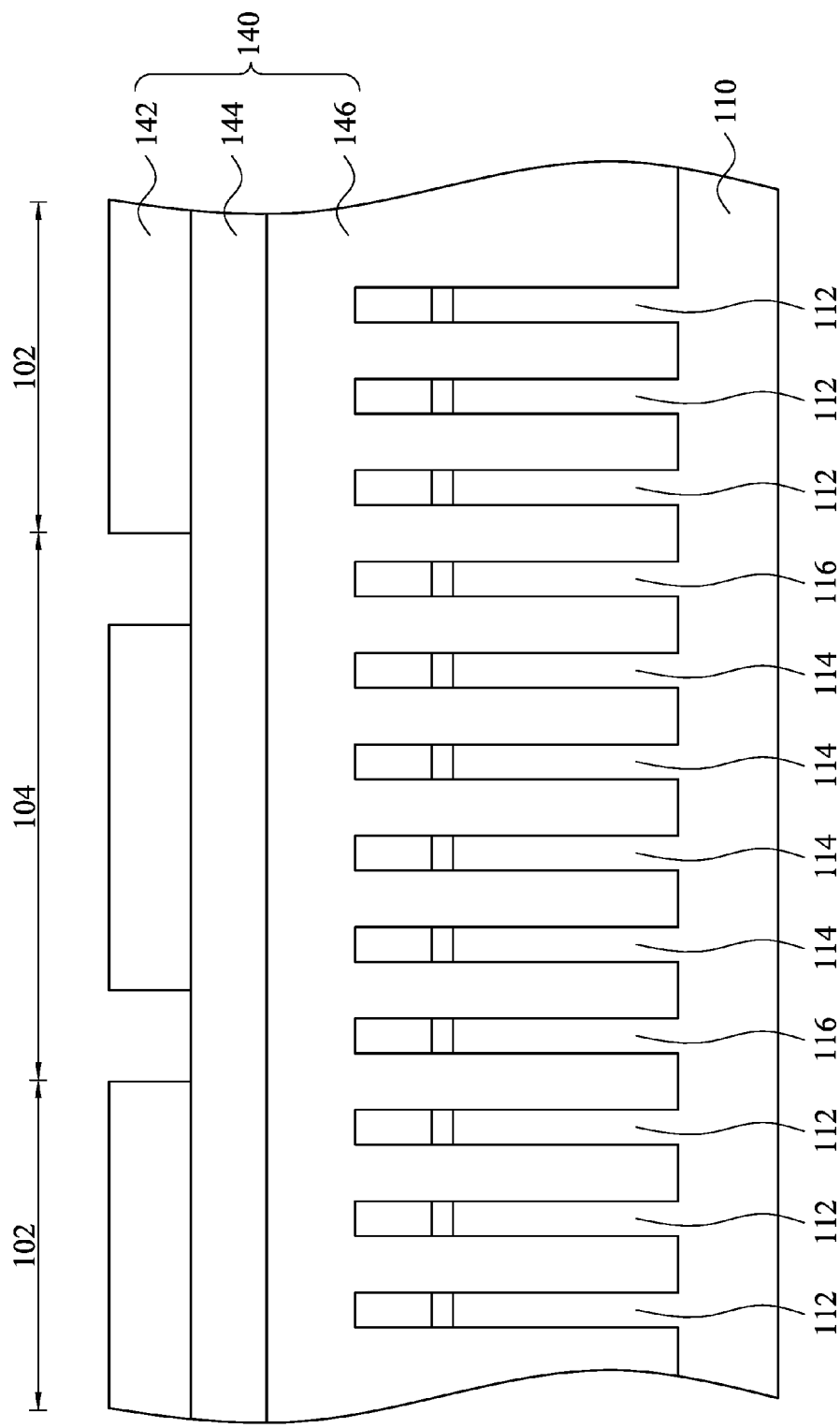

Reference is made to FIG. 1D. Another tri-layer photoresist 140 may be used, including a photoresist (PR) layer 142 as the top or uppermost portion, a middle layer 144, and a bottom layer 146. The tri-layer photoresist 140 covers the active semiconductor fins 112, the first dummy semiconductor fins 114, and the second dummy semiconductor fins 116. The tri-layer photoresist 140 provides the PR layer 142, the middle layer 144 which may include anti-reflective layers or backside anti-reflective layers to aid in the exposure and focus of the PR processing, and the bottom layer 146 which may be a hard mask material; for example, a nitride.

The PR layer 142 of the tri-layer photoresist 140 is then patterned. The patterned PR layer 142 exposes portions of the middle layer 144 disposed on the second dummy semiconductor fins 116. Meanwhile, another portions of the middle layer 144 disposed on the active dummy semiconductor fins 112 and the first dummy semiconductor fins 114 are still covered by the PR layer 142. To pattern the tri-layer photoresist 140, the PR layer 142 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 142. This patterned PR layer 142 is then used to etch the underlying middle layer 144 and bottom layer 146 to form an etch mask for the target features; here, the second dummy semiconductor fins 116.

Figure 1E:
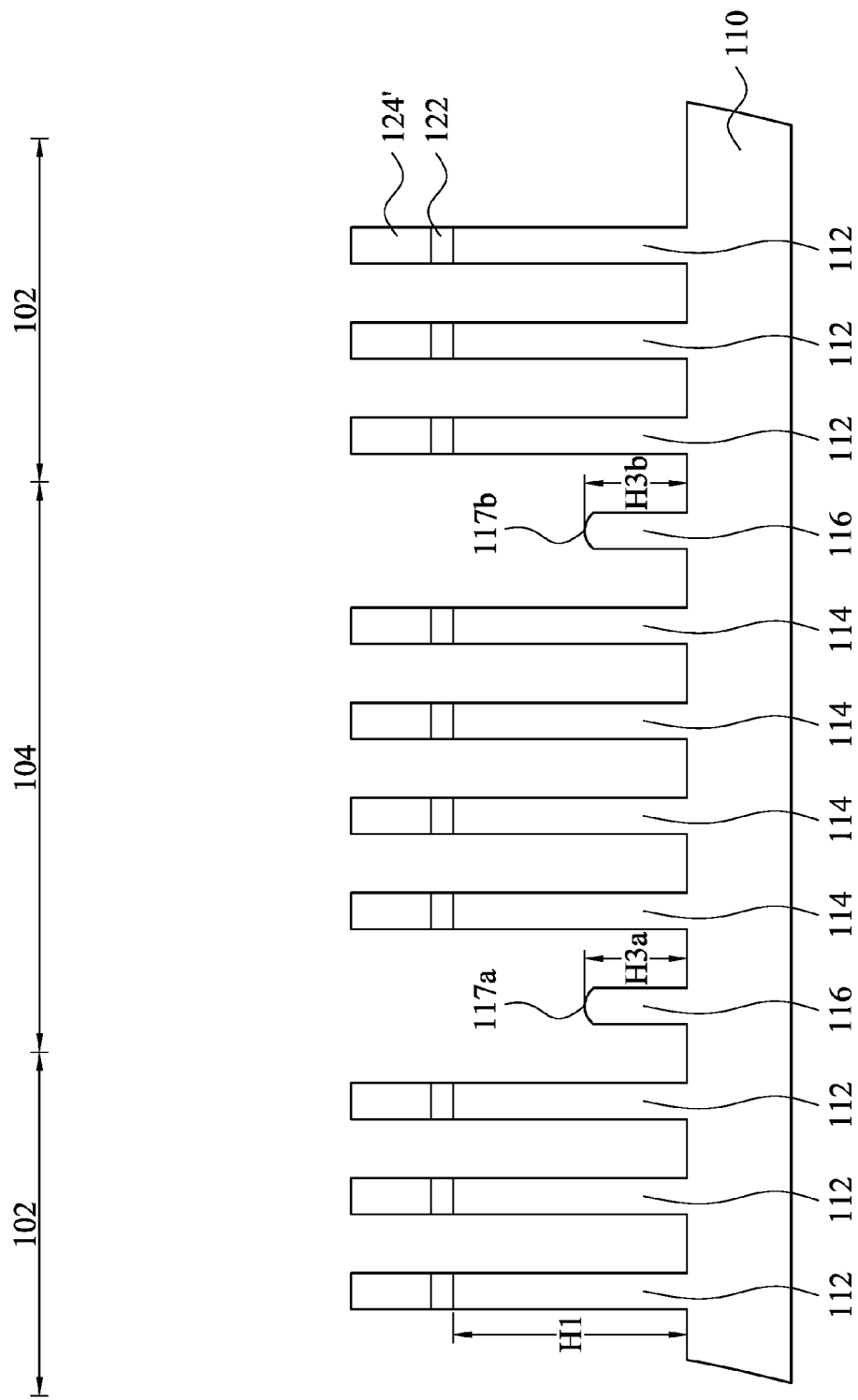

Reference is made to FIG. 1E. Using the patterned PR layer 142 (see FIG. 1D) as a mask, the middle layer 144 and the bottom layer 146 of the tri-layer photoresist 140 (see FIG. 1D) are etched by various methods, including a dry etch, a wet etch, or a combination of dry etch and wet etch. Also, at least portions of the second dummy semiconductor fins 116 are removed (or etched). The dry etching process may implement fluorine-containing gas (e.g., $CF_4$, $SF_6$, $CH_2F_2$, $CHF_3$, and/or $C_2F_6$), chlorine-containing gas (e.g., $C_{12}$, $CHC_{13}$, $CC_{14}$, and/or $BC_{13}$), bromine-containing gas (e.g., HBr and/or $CHBR_3$), oxygen-containing gas, iodine-containing gas, other suitable gases and/or plasmas, or combinations thereof. The etching process may include a multiple-step etching to gain etch selectivity, flexibility and desired etch profile. After the second dummy semiconductor fins 116 are partially removed, the PR layer 142, the middle layer 144 and the bottom layer 146 of the tri-layer photoresist 140 are removed.

In FIG. 1E, the heights H3a and H3b of the remaining second dummy semiconductor fins 116 can be about 17% to about 27% the height H1 of the active semiconductor fins 112. That is, the heights H3a and H3b of the remaining second dummy semiconductor fins 116 are about 17 nm to about 40.5 nm. At least one of the second dummy semiconductor fins 116 has a top surface 117a (117b). The top surface 117a (117b) can be non-concave, such as convex or substantially flat. In some embodiments, the top surface 117a (117b) of the second dummy semiconductor fin 116 is curved outwardly. Moreover, in some embodiments, the heights H3a and H3b of the two remaining second dummy semiconductor fins 116 are substantially the same. The term "substantially" as used herein may be applied to modify any quantitative representation which could permissibly vary without resulting in a change in the basic function to which it is related.

Figure 1F:
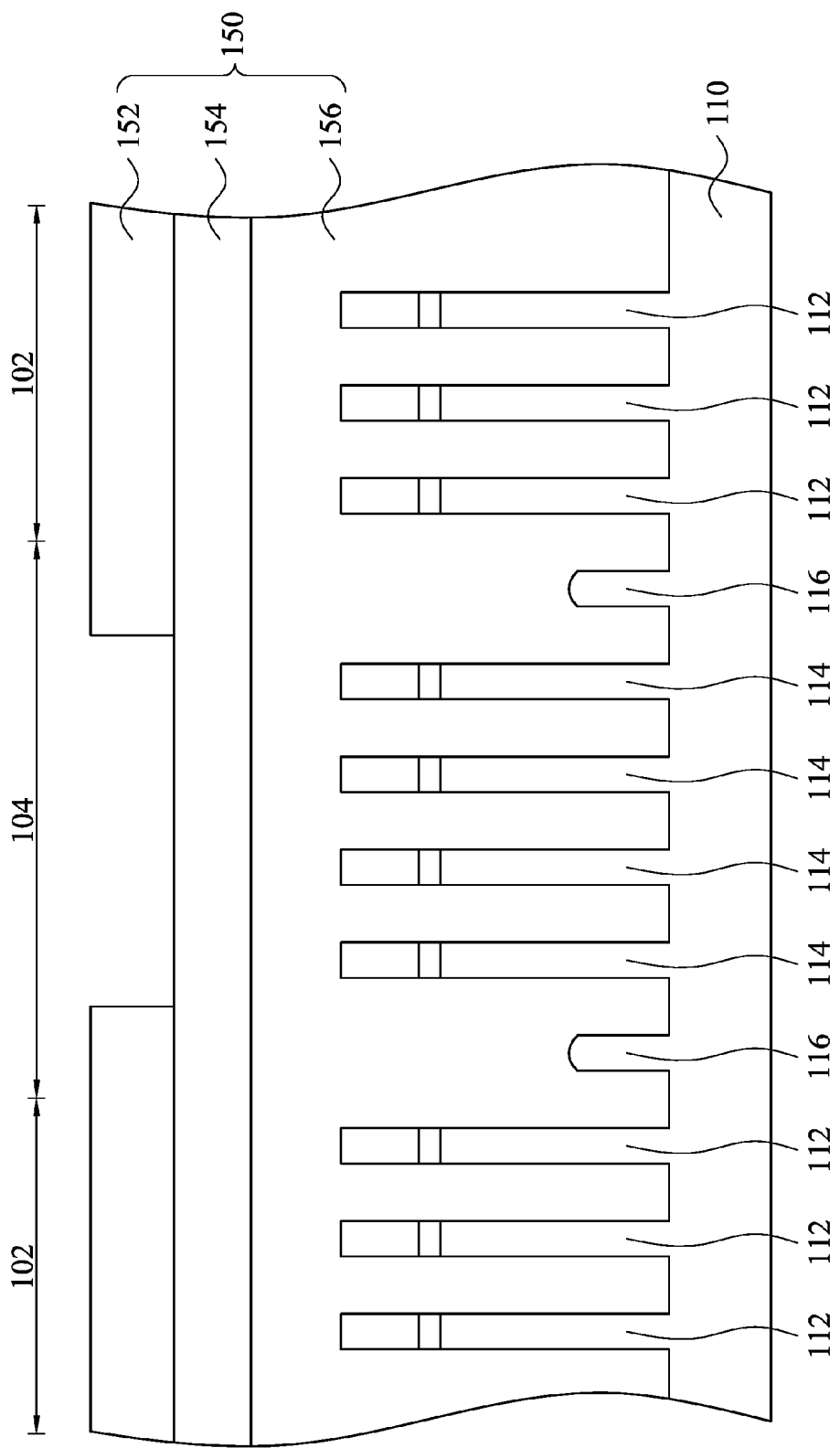

Reference is made to FIG. 1F. Still another tri-layer photoresist 150 may be used, including a photoresist (PR) layer 152 as the top or uppermost portion, a middle layer 154, and a bottom layer 156. The tri-layer photoresist 150 covers the active semiconductor fins 112, the first dummy semiconductor fins 114, and the remaining second dummy semiconductor fins 116. The tri-layer photoresist 150 provides the PR layer 152, the middle layer 154 which may include anti-reflective layers or backside anti-reflective layers to aid in the exposure and focus of the PR processing, and the bottom layer 156 which may be a hard mask material; for example, a nitride.

The PR layer 152 of the tri-layer photoresist 150 is then patterned. The patterned PR layer 152 exposes portions of the middle layer 154 disposed on the first dummy semiconductor fins 114. Meanwhile, another portions of the middle layer 154 disposed on the active dummy semiconductor fins 112 and the remaining second dummy semiconductor fins 116 are still covered by the PR layer 152. To pattern the tri-layer photoresist 150, the PR layer 152 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 152. This patterned PR layer 152 is then used to etch the underlying middle layer 154 and bottom layer 156 to form an etch mask for the target features; here, the first dummy semiconductor fins 114.

Figure 1G:
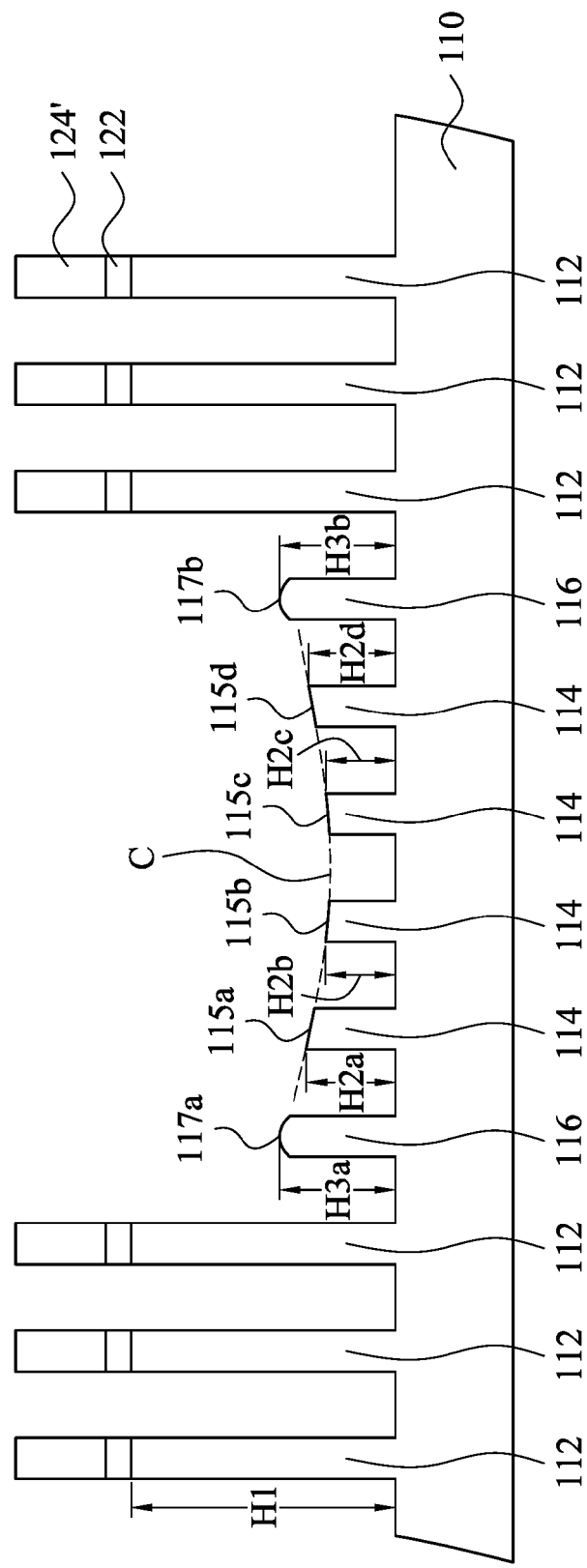

Reference is made to FIG. 1G. Using the patterned PR layer 152 (see FIG. 1F) as a mask, the middle layer 154 and the bottom layer 156 of the tri-layer photoresist 150 (see FIG. 1F) are etched by various methods, including a dry etch, a wet etch, or a combination of dry etch and wet etch. Also, at least portions of the first dummy semiconductor fins 114 are removed (or etched). The dry etching process may implement fluorine-containing gas (e.g., $CF_4$, $SF_6$, $CH_2F_2$, $CHF_3$, and/or $C_2F_6$), chlorine-containing gas (e.g., $C_{12}$, $CHC_{13}$, $CC_{14}$, and/or $BC_{13}$), bromine-containing gas (e.g., HBr and/or $CHBR_3$), oxygen-containing gas, iodine-containing gas, other suitable gases and/or plasmas, or combinations thereof. The etching process may include a multiple-step etching to gain etch selectivity, flexibility and desired etch profile. After the first dummy semiconductor fins 114 are partially removed, the PR layer 152, the middle layer 154 and the bottom layer 156 of the tri-layer photoresist 150 are removed.

In FIG. 1G, the heights H2a, H2b, H2c, and H2d of the remaining first dummy semiconductor fins 114 can be about 6% to about 16% the height H1 of the active semiconductor fins 112. That is, the heights H2a, H2b, H2c, and H2d of the remaining first dummy semiconductor fins 114 are about 6 nm to about 24 nm. Moreover, the heights H3a and H3b of the remaining second dummy semiconductor fins 116 are greater than the heights H2a, H2b, H2c, and H2d of the remaining first dummy semiconductor fins 114. In some embodiments, the height difference between the remaining first dummy semiconductor fins 114 and the second dummy semiconductor fins 116 (i.e., (H3a or H3b)−(H2a, H2b, H2c or H2d)) is about 3 nm to about 30 nm, or about 3% to about 17% of the height H1 of the active semiconductor fins 112. In some embodiments, the profile of the remaining first dummy semiconductor fins 114 is symmetric. Or, the heights H2a and H2d are substantially the same, the heights H2b and H2c are substantially the same, and the heights H2a and H2d are greater than the heights H2b and H2c, and the claimed scope is not limited in this respect. The terms "substantially" as used herein may be applied to modify any quantitative representation which could permissibly vary without resulting in a change in the basic function to which it is related.

The first dummy semiconductor fins 114 respectively have top surfaces 115a, 115b, 115c, and 115d. The top surfaces 115a, 115b, 115c, and 115d can be concave. That is, the top surfaces 115a, 115b, 115c, and 115d of the remaining first dummy semiconductor fins 114 are curved inwardly. At least one of the top surfaces 115a, 115b, 115c, and 115d of the remaining first dummy semiconductor fins 114 and at least one of the top surfaces 117a and 117b of the remaining second dummy semiconductor fins 116 are curved in different directions. For example, the top surfaces 115a, 115b, 115c, and 115d of the remaining first dummy semiconductor fins 114 are concave (or curved inwardly), and the top surfaces 117a and 117b of the remaining second dummy semiconductor fins 116 are non-concave, such as convex (or curved outwardly) or substantially flat. Moreover, in some embodiments, the top surfaces of at least two of the first dummy semiconductor fins 114 form a concave profile C. For example, in FIG. 1G, the top surfaces 115a, 115b, 115c, and 115d of the remaining first dummy semiconductor fins 114 form a concave profile.

According to the aforementioned embodiments, the dummy semiconductor fins (i.e., the first and the second dummy semiconductor fins) are removed (or etched or cut) using at least two removing processes (i.e., the processes of FIGS. 1E and 1G). Furthermore, the outer dummy semiconductor fins (i.e., the second dummy semiconductor fins) are removed before the inner dummy semiconductor fins (i.e., the first dummy semiconductor fins) are removed. Such processes can prevent the active semiconductor fins from being damaged during the removing processes of the dummy semiconductor fins. In greater detail, the second dummy semiconductor fins are removed in advance, such that a space is formed between the first dummy semiconductor fins and the active semiconductor fins. During the removing process of the first dummy semiconductor fins, this space can reduce the probability of etchant from damaging the active semiconductor fins.

Figure 1H:
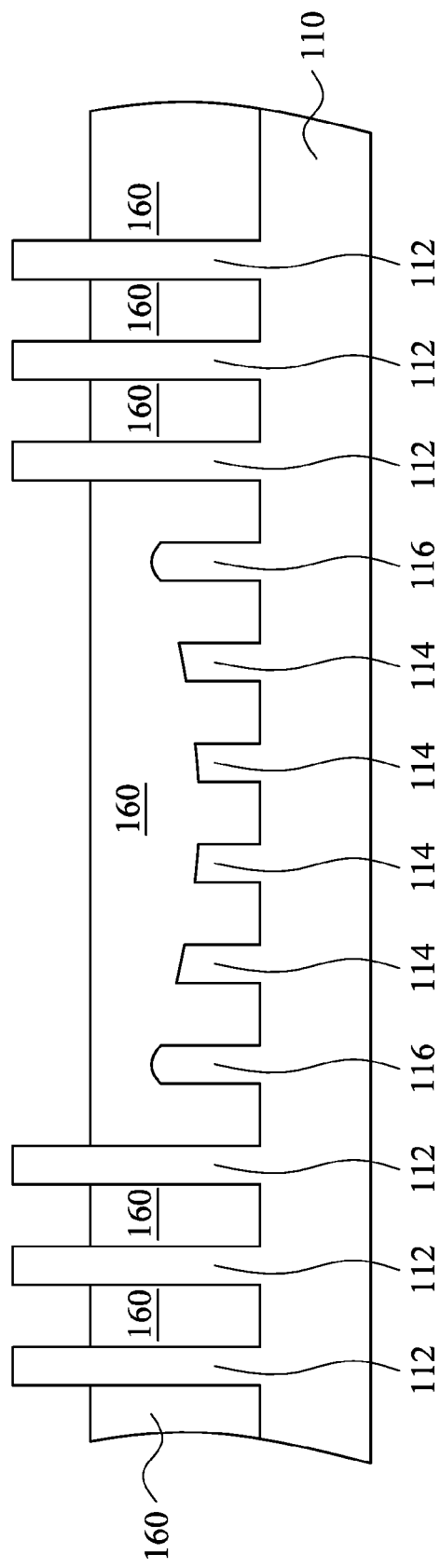

Reference is made to FIG. 1H. In some embodiments, at least one isolation structure 160 is formed to cover the first and the second dummy semiconductor fins 114 and 116 while leave the active semiconductor fins 112 uncovered. That is, the active semiconductor fins 112 protrude from the isolation structure 160, and the first and the second dummy semiconductor fins 114 and 116 are embedded under the isolation structure 160. The active semiconductor fins 112 can be source/drain features of at least one fin field effect transistor (finFET).

In some embodiments, the isolation structure 160 includes silicon oxide, silicon nitride, silicon oxynitride, other suitable materials, or combinations thereof. The isolation structure 160 is formed by suitable process. For example, the isolation structure 160 is formed by filling the trench between the semiconductor fins (i.e., the active semiconductor fins 112, and the first and the second dummy semiconductor fins 114 and 116) with one or more dielectric materials by using a chemical vapor deposition (CVD). In some embodiments, the isolation structure 160 may have a multi-layer structure such as a thermal oxide liner layer filled with silicon nitride or silicon oxide. At least one annealing process may be performed after the formation of the isolation structure 160. In some embodiments, the pad layer 122 and the mask layer 124' (see FIG. 1G) can be removed during the formation process of the isolation structure 160.

After forming the isolation structure 160, the semiconductor device may undergo further CMOS or MOS technology processing to form various features and regions. For example, further fabrication processes may include, among other things, forming a gate structure on the substrate 110, including on a portion of the active semiconductor fins 112 and forming source and drain (S/D) regions on opposite sides of the gate structure, including another portion of the active semiconductor fins 112. The formation of the gate structure may include depositing, patterning, and etching processes. A gate spacer may be formed on the walls of the gate structure by deposition and etching techniques. S/D regions may be formed by recess, epitaxially growing and implant techniques. Additional processes can be provided before, during, and after the processes mentioned above, and some of the processes described can be replaced or eliminated for other embodiments of the method.

Subsequent processing may also form various contacts/vias/lines and multilayer interconnect features (e.g., metal layers and interlayer dielectrics) on the substrate 110, configured to connect the various features or structures of the semiconductor device. For example, a multilayer interconnection includes vertical interconnects, such as conventional vias or contacts, and horizontal interconnects, such as metal lines. The various interconnection features may implement various conductive materials including copper, tungsten, and/or silicide. In some embodiments, a damascene and/or dual damascene process is used to form a copper related multilayer interconnection structure.

Figure 2:
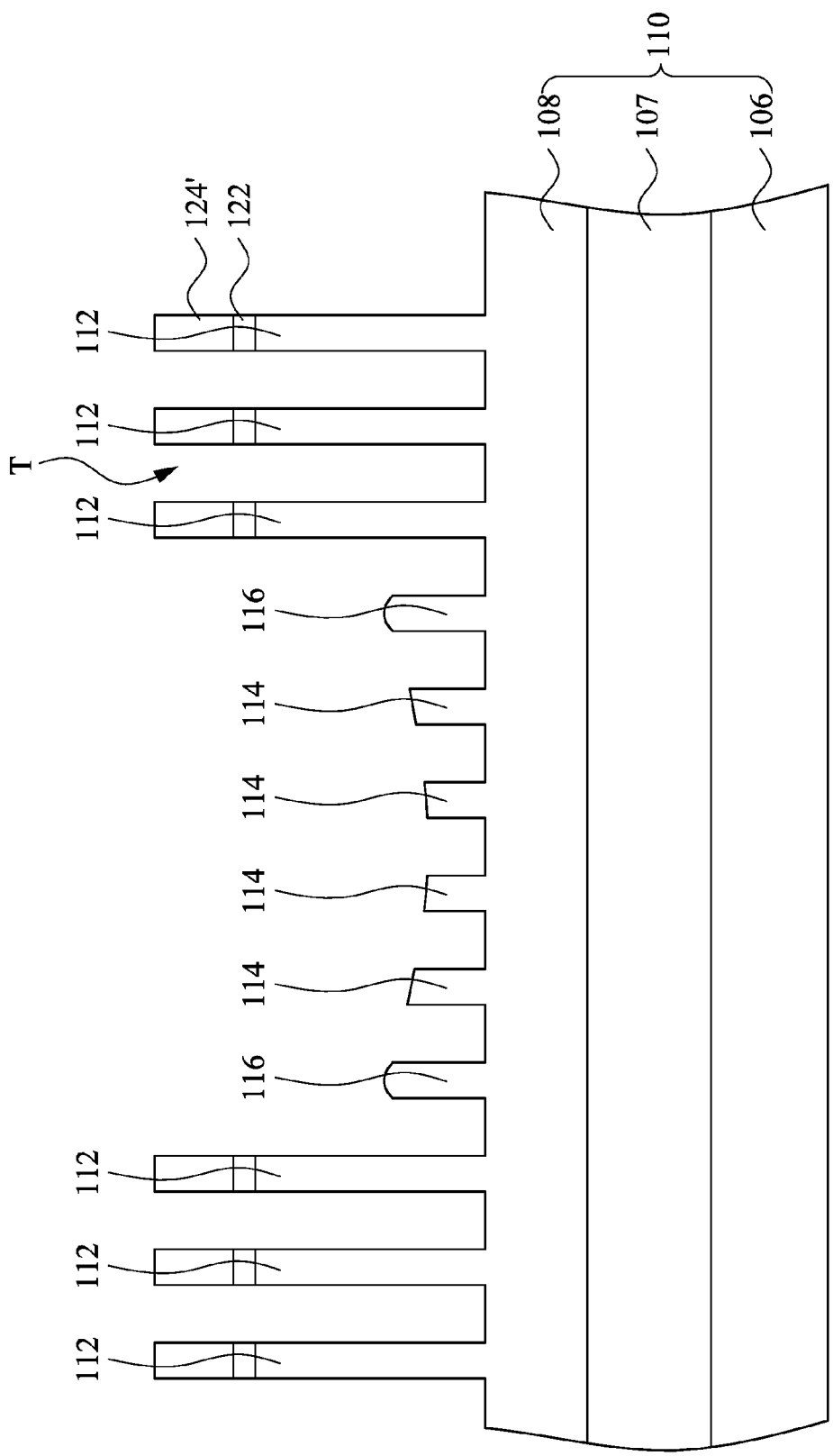
FIG. 2 is a cross-sectional view of a semiconductor device in accordance with some embodiments of the present disclosure.

FIG. 2 is a cross-sectional view of a semiconductor device in accordance with some embodiments of the present disclosure. The difference between the semiconductor devices of FIGS. 1G and 2 is the components of the substrate. In FIG. 2, the substrate 110 includes a first portion 106, a second portion 107, and a third portion 108. The second portion 107 is disposed on the first portion 106, and the third portion 108 is disposed on the second portion 107, such that the first portion 106, the second portion 107, and the third portion 108 are stacked to form the substrate 110. The first portion 106 and the second portion 107 have different material compositions, and the second portion 107 and the third portion 108 have different material compositions. In some embodiments, the first portion 106 and the third portion 108 of the substrate 110 are made of substantially the same material. For example, the first portion 106 and the third portion 108 of the substrate include silicon, such as bulk silicon, and the second portion 107 of the substrate 110 includes silicon, germanium, and oxide, such as SiGeO. Therefore, the first portion 106, the second portion 107, and the third portion 108 form Si/SiGeO/Si stacked layers. Although in FIG. 2, at least one trench T between adjacent semiconductor fins (i.e., the first and the second dummy semiconductor fins and the active semiconductor fins) is formed in the third portion 108 of the substrate 110. That is, the bottom surface of the trench T is higher than the interface of the second portion 107 and the third portion 108 of the substrate 110. However, in some other embodiments, the trench T can expose the second portion 107 of the substrate 110, and the claimed scope is not limited in this respect. Other relevant structural details of the semiconductor device of FIG. 2 are similar to the semiconductor device of FIG. 1G, and, therefore, a description in this regard will not be repeated hereinafter.

According to some embodiments, a semiconductor device includes a substrate, at least one active semiconductor fin, at least one first dummy semiconductor fin, and at least one second dummy semiconductor fin. The active semiconductor fin is disposed on the substrate. The first dummy semiconductor fin is disposed on the substrate. The second dummy semiconductor fin is disposed on the substrate and between the active semiconductor fin and the first dummy semiconductor fin. A top surface of the first dummy semiconductor fin and a top surface of the second dummy semiconductor fin are curved in different directions.

According to some embodiments, a semiconductor device includes a substrate, at least one active semiconductor fin, a plurality of first dummy semiconductor fins, and at least one second dummy semiconductor fin. The active semiconductor fin is disposed on the substrate. The first dummy semiconductor fins are disposed on the substrate. Top surface of the first dummy semiconductor fins form a concave profile. The second dummy semiconductor fin is disposed on the substrate and between the active semiconductor fin and the first dummy semiconductor fins. A top surface of the second dummy semiconductor fin is non-concave.

According to some embodiments, a method for manufacturing a semiconductor fin includes forming at least one active semiconductor fin, at least one first dummy semiconductor fin, and at least one second dummy semiconductor fin on a substrate. The second dummy semiconductor fin is disposed between the active semiconductor fin and the first dummy semiconductor fin. At least a portion of the second dummy semiconductor fin is removed. At least a portion of the first dummy semiconductor fin is removed after the portion of the second dummy semiconductor fin is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   at least one active semiconductor fin disposed on the substrate;
   at least one first dummy semiconductor fin disposed on the substrate; and
   at least one second dummy semiconductor fin disposed on the substrate and between the active semiconductor fin and the first dummy semiconductor fin, wherein a top surface of the first dummy semiconductor fin is curved toward the substrate, and wherein a top surface of the second dummy semiconductor fin is curved away from the substrate.

2. The semiconductor device of claim 1, wherein the second dummy semiconductor fin is adjacent to the active semiconductor fin and the first dummy semiconductor fin.

3. The semiconductor device of claim 1, further comprising:
   an isolation structure covering the first dummy semiconductor fin and the second dummy semiconductor fin while leaving the active semiconductor fin uncovered.

4. The semiconductor device of claim 1, wherein the substrate is made of bulk silicon.

5. The semiconductor device of claim 1, wherein the substrate comprises:
   a first portion;
   a second portion disposed on the first portion, wherein the first portion and the second portion have different material compositions; and
   a third portion disposed on the second portion, wherein the second portion and the third portion have different material compositions.

6. The semiconductor device of claim 5, wherein the first portion and the third portion of the substrate are made of substantially the same material.

7. The semiconductor device of claim 5, wherein the first portion and the third portion of the substrate comprise silicon, and the second portion of the substrate comprises silicon, germanium, and oxide.

8. The semiconductor device of claim 1, wherein at least two of the second dummy semiconductor fins are disposed between at least two of the active semiconductor fins, and the first dummy semiconductor fin is disposed between the second dummy semiconductor fins.

9. The semiconductor device of claim 8, wherein the second dummy semiconductor fins have substantially the same height.

10. The semiconductor device of claim 1, wherein the first dummy semiconductor fin is shorter than the second dummy semiconductor fin.

11. A semiconductor device comprising:
    a substrate;
    at least one active semiconductor fin disposed on the substrate;
    a plurality of first dummy semiconductor fins disposed on the substrate, wherein top surfaces of the first dummy semiconductor fins form a concave profile; and
    at least one second dummy semiconductor fin disposed on the substrate and between the active semiconductor fin and the first dummy semiconductor fins, wherein a top surface of the second dummy semiconductor fin is non-concave.

12. The semiconductor device of claim 11, wherein the active semiconductor fin has a first height, at least one of the first dummy semiconductor fins has a second height shorter than the first height of the active semiconductor fin.

13. The semiconductor device of claim 12, wherein the second dummy semiconductor fin has a third height greater than the second height of said at least one of the first dummy semiconductor fins and shorter than the first height of the active semiconductor fin.

14. The semiconductor device of claim 11, further comprising:
    an isolation structure disposed on the first dummy semiconductor fin and the second dummy semiconductor fin while leaving the active semiconductor fin uncovered.

15. A method for manufacturing a semiconductor fin structure, the method comprising:
    forming at least one active semiconductor fin, at least one first dummy semiconductor fin, and at least one second dummy semiconductor fin on a substrate, wherein the second dummy semiconductor fin is disposed between the active semiconductor fin and the first dummy semiconductor fin;
    removing at least a portion of the second dummy semiconductor fin, wherein a top surface of a remaining second dummy semiconductor fin is curved away from the substrate; and
    removing at least a portion of the first dummy semiconductor fin after the removing the portion of the second dummy semiconductor fin, wherein a top surface of a remaining first dummy semiconductor fin is curved toward the substrate.

16. The method of claim 15, wherein the removing the portion of the second dummy semiconductor fin comprises:
    forming an anti-reflective layer to cover the active semiconductor fin, the first dummy semiconductor fin, and the second dummy semiconductor fin;
    forming a patterned mask on the anti-reflective layer, wherein the patterned mask exposes a portion of the anti-reflective layer disposed on the second dummy semiconductor fin; and
    removing the portion of the anti-reflective layer and the portion of the second dummy semiconductor fin exposed by the patterned mask.

17. The method of claim 15, wherein the removing the portion of the first dummy semiconductor fin comprises:
    forming an anti-reflective layer to cover the active semiconductor fin, the first dummy semiconductor fin, and the remaining second dummy semiconductor fin after the portion of the second dummy semiconductor fin is removed;
    forming a patterned mask on the anti-reflective layer, wherein the patterned mask exposes a portion of the anti-reflective layer disposed on the first dummy semiconductor fin; and
    removing the portion of the anti-reflective layer and the portion of the first dummy semiconductor fin exposed by the patterned mask.

18. The method of claim 15, further comprising:
    forming an isolation structure to cover the remaining first dummy semiconductor fin and the remaining second dummy semiconductor fin while leaving the active semiconductor fin uncovered.

19. The method of claim 15, wherein the substrate is made of silicon.

20. The method of claim 15, wherein the substrate comprises Si/SiGeO/Si stacked layers.

\* \* \* \* \*